United States Patent
Boone, Jr. et al.

(10) Patent No.: US 8,213,271 B2
(45) Date of Patent: Jul. 3, 2012

(54) SYSTEM, METHOD AND APPARATUS FOR INTERNAL POLARIZATION ROTATION FOR HORIZONTAL CAVITY, SURFACE EMITTING LASER BEAM FOR THERMALLY ASSISTED RECORDING IN DISK DRIVE

(75) Inventors: Thomas Dudley Boone, Jr., San Jose, CA (US); Timothy Carl Strand, San Jose, CA (US); Bruce David Terris, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 659 days.

(21) Appl. No.: 12/346,930

(22) Filed: Dec. 31, 2008

(65) Prior Publication Data
US 2010/0165801 A1    Jul. 1, 2010

(51) Int. Cl.
*G11B 11/00*    (2006.01)
(52) U.S. Cl. ............................... 369/13.33; 369/112.27
(58) Field of Classification Search ............... 369/13.32, 369/13.17, 13.33, 13.13, 112.27, 13.11, 13.14, 369/13.02, 112.09; 360/110, 125.03, 59, 360/313, 128; 385/38, 129; 372/108, 105, 372/12, 31
See application file for complete search history.

(56) References Cited

U.S. PATENT DOCUMENTS

| | | | |
|---|---|---|---|
| 3,914,710 A | 10/1975 | Young | |
| 4,796,226 A | 1/1989 | Valette | |
| 5,432,763 A | 7/1995 | Campbell et al. | |
| 6,081,499 A | 6/2000 | Berger et al. | |
| 6,631,227 B2 | 10/2003 | Kasama et al. | |
| 7,042,810 B2 | 5/2006 | Akiyama et al. | |
| 7,310,206 B2 | 12/2007 | Liu et al. | |
| 7,480,214 B2* | 1/2009 | Challener et al. | 369/13.24 |
| 7,663,982 B2* | 2/2010 | Cho et al. | 369/13.32 |
| 7,791,839 B2* | 9/2010 | Olson et al. | 360/125.31 |
| 7,969,826 B2* | 6/2011 | Naniwa et al. | 369/13.13 |
| 2005/0122850 A1 | 6/2005 | Challener et al. | |
| 2007/0165494 A1 | 7/2007 | Cho et al. | |
| 2008/0002529 A1 | 1/2008 | Sekine et al. | |
| 2008/0049563 A1 | 2/2008 | Konno et al. | |
| 2008/0089187 A1 | 4/2008 | Suh et al. | |
| 2008/0130155 A1 | 6/2008 | Naniwa et al. | |
| 2008/0151360 A1 | 6/2008 | Stipe | |

FOREIGN PATENT DOCUMENTS

| | | |
|---|---|---|
| JP | 2007317259 | 12/2007 |
| JP | 2008010094 | 1/2008 |
| WO | 2008062677 A1 | 5/2008 |

* cited by examiner

*Primary Examiner* — Ali Neyzari

(57) ABSTRACT

A horizontal cavity, surface emitting laser (HCSEL) with internal polarization rotation is used in thermally assisted recording in hard disk drives. The desired polarization of the laser is accomplished with two beam reflections off of facets within the diode. The facets are formed in a single ion beam etching step. This device can be used in a thermally assisted recording head to produce polarization incident on the disk aligned with the direction of the tracks on the disk.

8 Claims, 9 Drawing Sheets

SYSTEM, METHOD AND APPARATUS FOR INTERNAL POLARIZATION ROTATION FOR HORIZONTAL CAVITY, SURFACE EMITTING LASER BEAM FOR THERMALLY ASSISTED RECORDING IN DISK DRIVE

BACKGROUND OF THE INVENTION

1. Technical Field

The present invention relates in general to polarization rotation in horizontal cavity, surface emitting lasers and, in particular, to an improved system, method and apparatus for the use of horizontal cavity, surface emitting lasers for thermally assisted recording in hard disk drives.

2. Description of the Related Art

Horizontal cavity, surface-emitting lasers, or HCSELs, have been developed in recent years to combine some of the best properties of conventional, end-firing diode lasers and vertical-cavity surface-emitting lasers (VCSELs). Such lasers have an output that is generally polarized in the plane of the underlying wafer. Some applications, however, require polarization rotation to properly orient the laser polarization relative to the target.

For example, some implementations of thermally assisted recording (TAR) heads for hard disk drives require rotation of the polarized laser light beam. This step is useful since the normal polarization coming from the laser is orthogonal to the polarization at the near field aperture used in TAR. Rotating the polarization within the slider waveguide is accomplished by structures that are very difficult to fabricate and greatly complicate an already difficult fabrication process. Furthermore the efficiency of polarization rotation for the very short device lengths required in the slider remains to be demonstrated.

FIGS. 2A-2C depict a mirror-integrated laser diode 21, commonly referred to as a HCSEL. Laser diode 21 produces a beam 23 that is directed through the laser cavity and reflected downward by a facet 25 as a reflected beam 27 toward a target. Importantly, the reflected beam 27 is polarized (see reference arrow 33) in a direction that is orthogonal to a longitudinal direction of the laser diode 21.

For some applications, however, the polarization of the reflected laser beam must be reoriented in a direction that aligns with the track direction. Examples of prior art techniques for reorienting a polarized beam include discrete components such as half-wave plates, non-linear effects in fibers or active elements using Faraday or Kerr effects. Discrete components are not feasible for small scale applications due to their large size and cost. Moreover, some techniques are wavelength dependent. Mode-locked lasers often use nonlinearity-induced polarization rotation, which requires high power and is also prohibitive in terms of size and cost. Polarized continuous wave crystalline lasers (see, e.g., U.S. Pat. No. 3,914,710) induce thermal stress in the laser rod via optical pumping to cause polarization rotation. Although these conventional solutions are workable in certain applications or with specific devices, an improved design that works for HCSELs would be desirable.

SUMMARY OF THE INVENTION

Embodiments of a system, method, and apparatus for internal polarization rotation in horizontal cavity, surface emitting lasers for thermally assisted recording in hard disk drives are disclosed. The desired polarization rotation of the laser light and its application to the disk is efficiently handled with two beam reflections. The reflections are produced by two facets that are formed as an integral part of the laser. These facets may be manufactured without adding significant cost or complexity to the laser.

In one embodiment, the laser has an active layer that is parallel to the disk. The first facet is normal to the active layer and at angle of 45 degrees relative to the laser beam. The second facet is oriented at an angle of 45 degrees relative to the active layer and intersects the active layer in a line that is normal to incident laser beam. The laser polarization is initially in the plane of the active layer and perpendicular to the propagation direction. After the first facet, the beam is deflected by 90 degrees in the plane of the active layer. The polarization is still in that plane, but is now oriented 90 degrees to the initial polarization direction. After the second facet, the beam is propagating normal to the active layer and the polarization is still parallel to the active layer, but rotated 90 degrees from its initial orientation. In this orientation it is aligned with the direction of the tracks on the disk.

Moreover, in one embodiment, both etched facets in the HCSEL are fabricated simultaneously in a single etch process so that no additional processing is required during manufacturing. This design allows rotation of the polarization without additional fabrication cost. The invention is a much simpler and more cost effective solution than rotating the laser beam within the slider waveguide or by other conventional solutions.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the present invention are attained and can be understood in more detail, a more particular description of the invention briefly summarized above may be had by reference to the embodiments thereof that are illustrated in the appended drawings. However, the drawings illustrate only some embodiments of the invention and therefore are not to be considered limiting of its scope as the invention may admit to other equally effective embodiments.

DETAILED DESCRIPTION OF THE INVENTION

Figure 6:
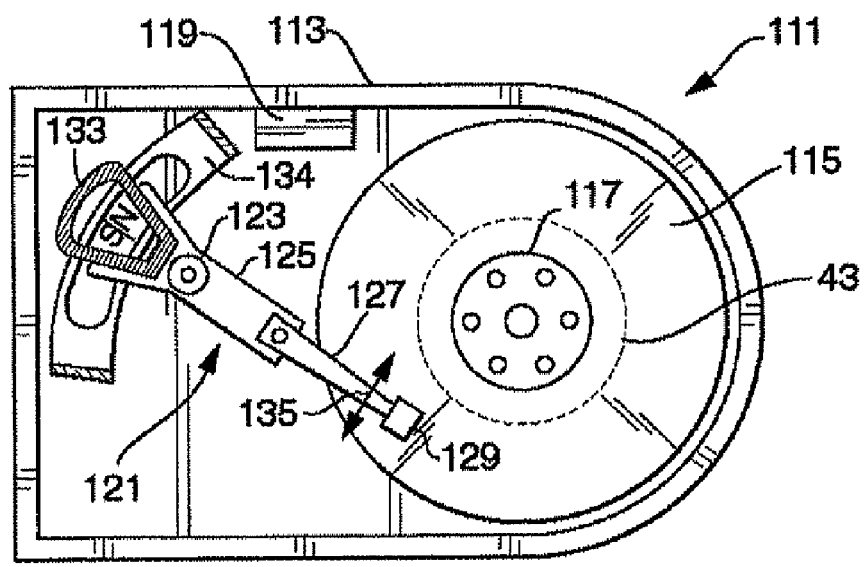
FIG. 6 is a schematic plan view of one embodiment of disk drive constructed in accordance with the invention.
Figure 7:
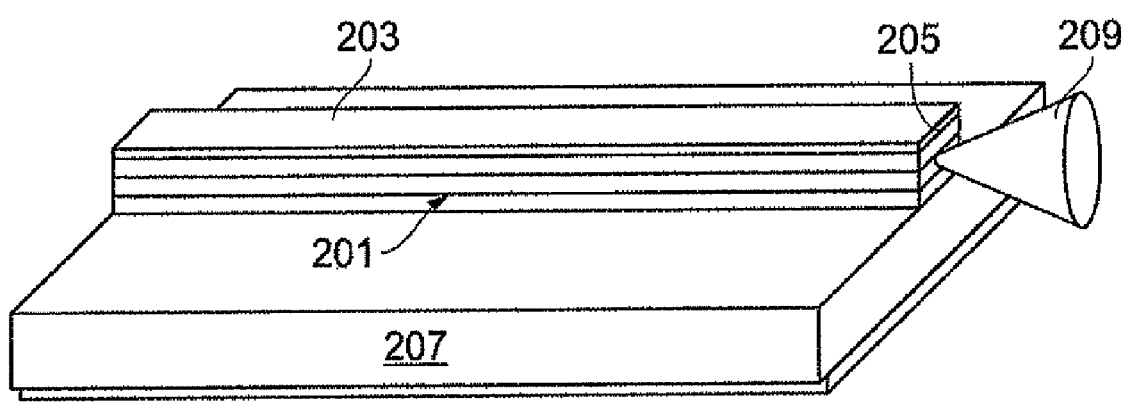
FIG. 7 is a schematic isometric view of a conventional laser diode structure.

FIGS. 1 and 3-12 depict embodiments of a system, method and apparatus for internal polarization rotation of horizontal cavity, surface emitting laser beams for thermally assisted recording (TAR) in hard disk drives. For example, FIG. 6 is a schematic drawing of one embodiment of an information storage system comprising a magnetic hard disk file or drive 111 for a computer system. Drive 111 has an enclosure having a base 113 containing at least one magnetic disk 115. Disk 115 is rotated by a spindle motor assembly having a central drive hub 117. An actuator 121 comprises one or more parallel actuator arms 125 in the form of a comb that is pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered load beam and suspension 127. A magnetic read/write transducer or head is mounted on a slider 129 and secured to a flexure that is flexibly mounted to each suspension 127. The read/write heads magnetically read data from and/or magnetically write data to disk 115. The level of integration called the head gimbal assembly is the head and the slider 129, which are mounted on suspension 127. The slider 129 is usually bonded to the end of suspension 127. The head is typically formed from ceramic or intermetallic materials and is pre-loaded against the surface of disk 115 by suspension 127.

Suspensions 127 have a spring-like quality which biases or urges the air bearing surface of the slider 129 against the disk 115 to enable the creation of the air bearing film between the slider 129 and disk surface. A voice coil 133 housed within a voice coil motor magnet assembly 134 is also mounted to arms 125 opposite the head gimbal assemblies. Movement of the actuator 121 (indicated by arrow 135) by controller 119 moves the head gimbal assemblies radially across tracks on the disk 115 until the heads settle on their respective target tracks.

Figure 1:
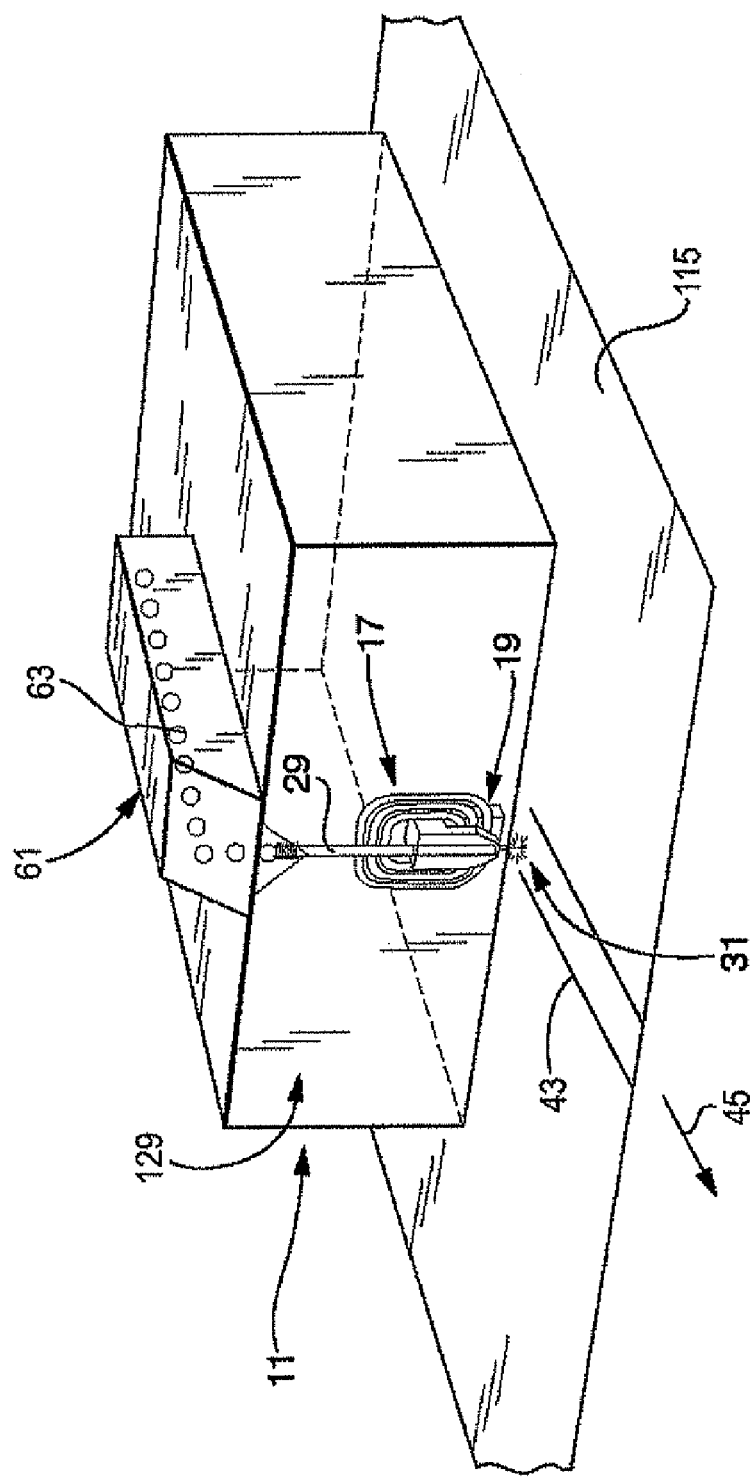
FIG. 1 is a schematic isometric view of one embodiment of a thermally assisted recording (TAR) device.
Figure 2A:
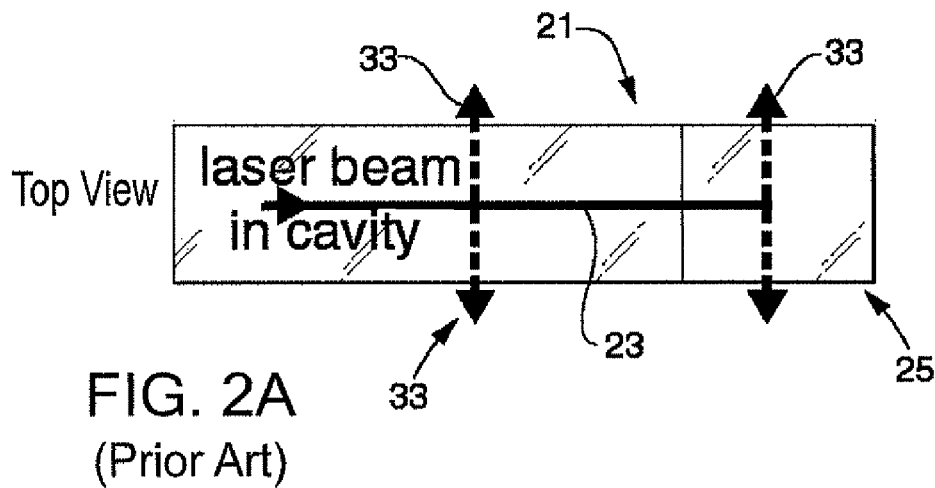
FIGS. 2A-2C are schematic top, side and end views, respectively, of a laser for a conventional TAR device.
Figure 2B:
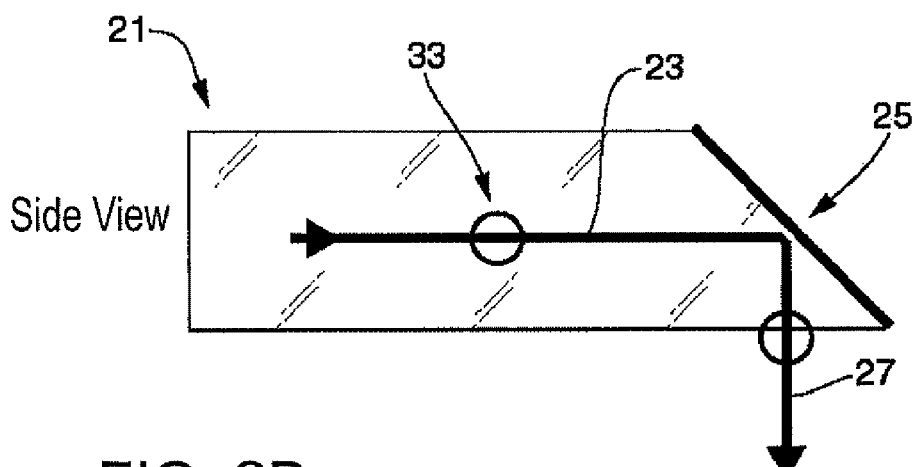
Figure 2C:
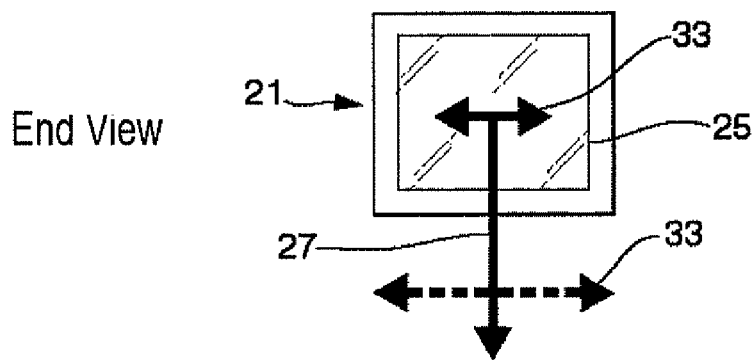
Figure 3A:
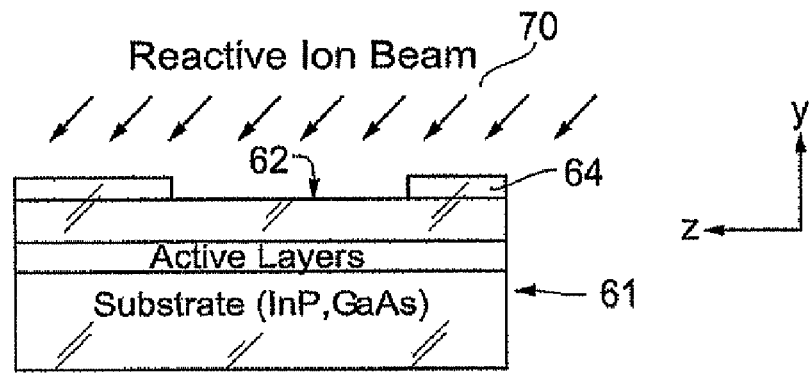
FIGS. 3A-3C are schematic side and isometric views of an etching process.
Figure 3B:
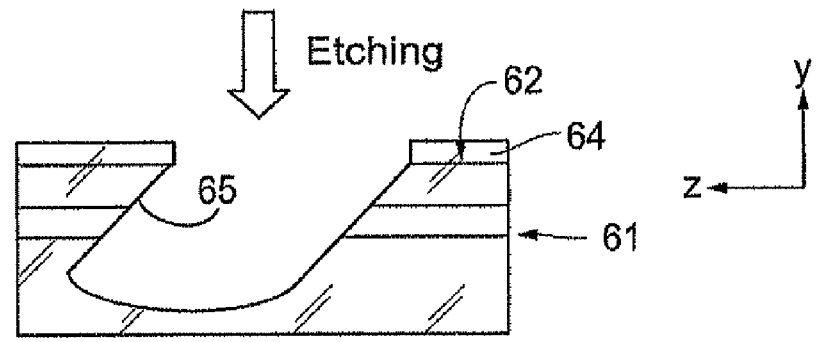
Figure 3C:
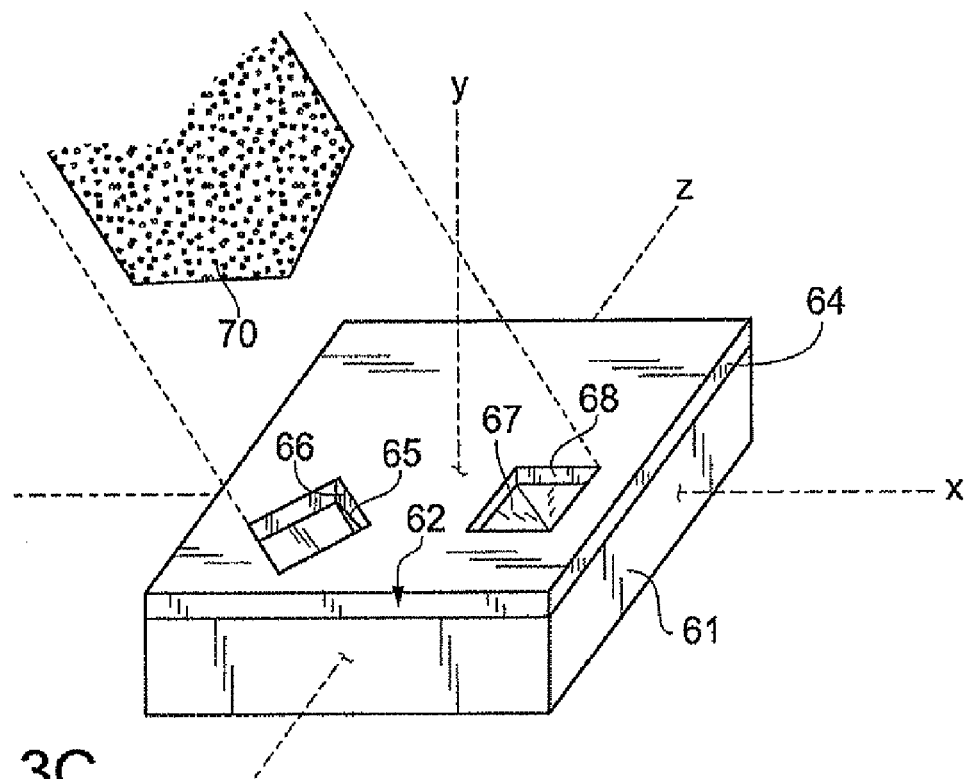

Horizontal cavity, surface-emitting lasers, or HCSELs, have been developed in recent years to combine some of the best properties of conventional, end-firing diode lasers and vertical-cavity surface-emitting lasers (VCSELs). FIG. 1 depicts an example of an implementation of a thermally assisted recording (TAR) device 11 for writing data to magnetic media disk 115. The slider body 129 includes a coil 17 and magnetic write pole 19. The mirror-integrated laser diode 61, or HCSEL, is mounted to the slider body 129 and produces beam 63. As will be described herein, the beam 63 is directed through the laser cavity and reflected by facets toward the disk 115. The reflected beam is directed into a waveguide 29 and emitted from an optical near-field aperture 31 at track 43 having direction 45 on disk 115.

In conventional diode lasers (see, e.g., FIG. 7), the active layer 201 is in the plane of the wafer. The gain region is formed by patterned contacts on the top and bottom of the laser chip. A waveguide is formed by limiting the lateral extent of the gain region defined by the contacts 203 (gain guiding) and/or by defining a region of higher effective index of refraction, e.g. by etching the chip to form a ridge waveguide.

The end facets 205 on conventional diode lasers are formed by cleaving the substrate 207. These facets can then be coated to adjust their reflectivity, the higher the reflectivity the higher the Q of the cavity. This process can produce high quality lasers with low losses and low threshold currents. It also can produce very high power lasers. These can be designed to emit in a single transverse mode which is important for many applications. The laser emission 209 emanates from an area that is generally very small, on the order of a few microns across and is generally elliptical with the long axis in the plane of the active layer 201. The emission is generally highly polarized with the polarization direction being in the plane of the active layer and normal to the beam propagation direction. Since the laser emission comes from the edge of the laser device, these lasers are called edge-emitting lasers.

Figure 8:
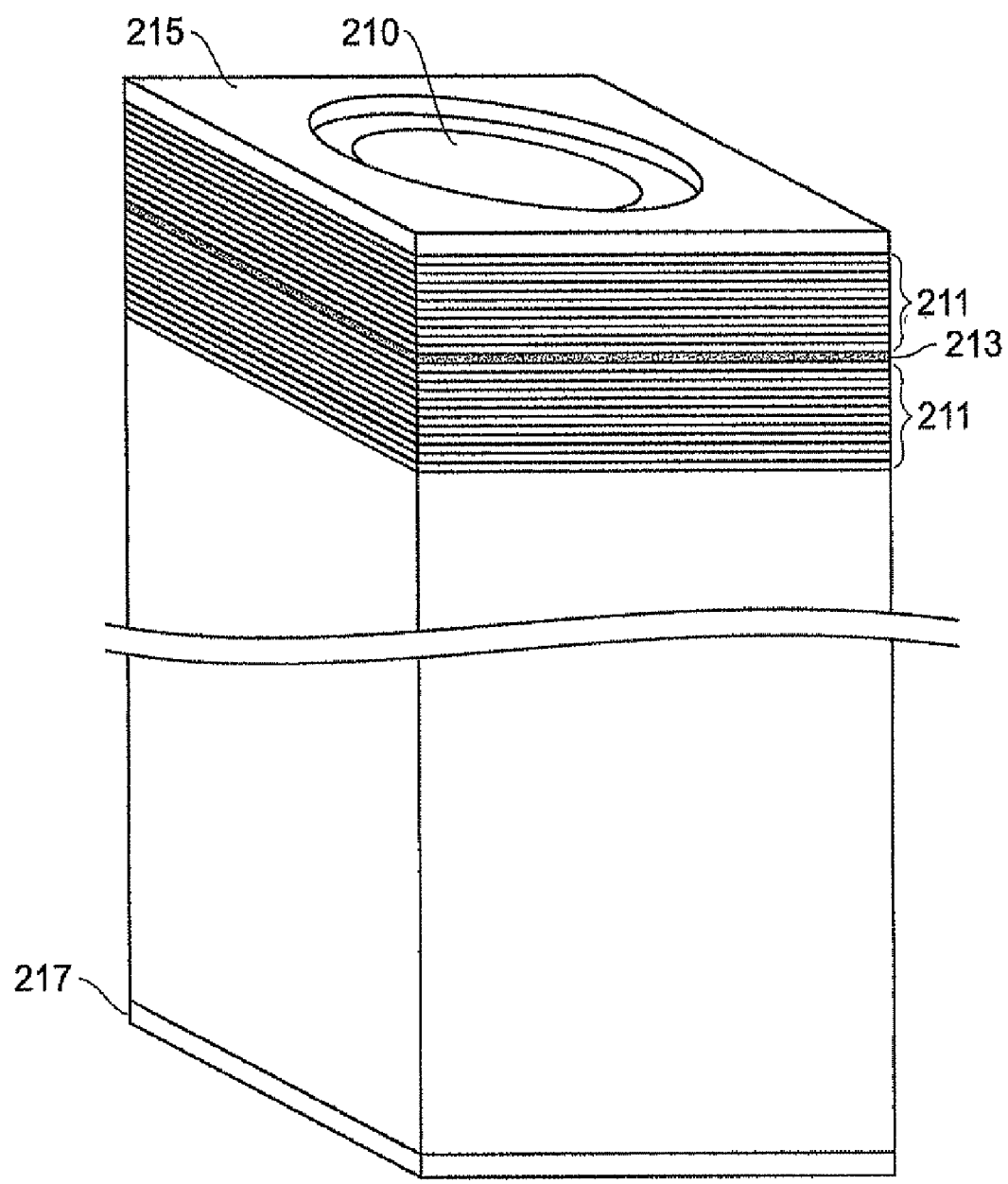
FIG. 8 is a schematic isometric view of a VCSEL structure.
Figure 9:
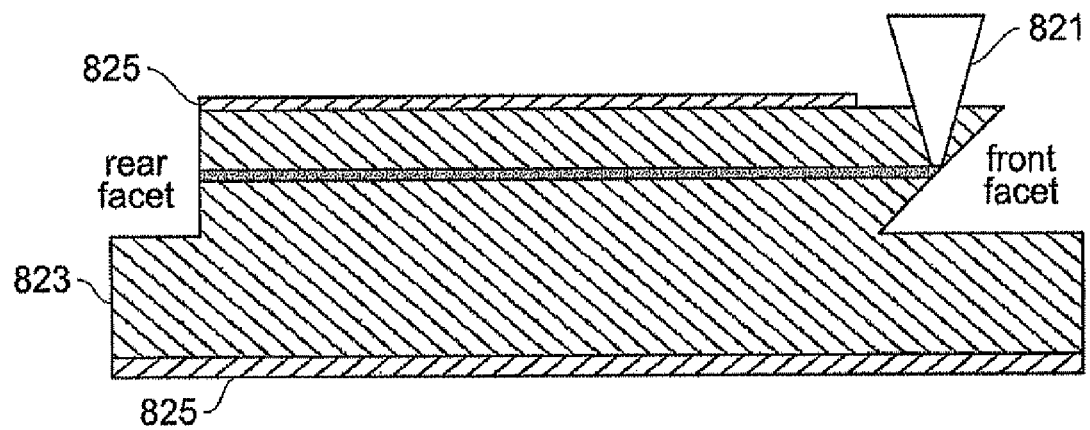
FIG. 9 is a schematic sectional side view of a HCSEL structure.

As shown in FIG. 8, another type of laser is the vertical-cavity surface-emitting laser (VCSEL), which emits from an area 210 in a direction that is normal to the wafer surface, as the name implies. The cavity is formed by a pair of Bragg reflectors 211 surrounding the active region, which is generally a multi-quantum well structure 213. All these layers are parallel to the chip surface and are formed by deposition processes. Electrical contacts 215, 217 are deposited on the top and bottom surfaces of the chip to drive the laser. An advantage of the VCSEL over the conventional edge emitter is that that laser can be tested at the wafer level since the emission surface 210 is on the wafer surface. VCSELs generally have a larger output area for the beam and thus a lower beam divergence than typical edge emitting lasers. Due to the larger lateral extent of the cavity, these are generally multi-mode emitters and not highly polarized.

The horizontal cavity, surface emitting laser or HCSEL (FIG. 9) is the latest development in this evolution of solid-state diode lasers. It combines the ability to do wafer-level testing with a structure that is very similar to the conventional edge emitting device. This enables high-power, single-mode lasers to be made with wafer-level testing. The surface emitting feature also enables some applications where the surface emission facilitates integration with other devices. Like the edge-emitting laser, the HCSEL emission 821 is generally highly polarized, with the polarization direction lying in the plane of the active layer 823 between the contacts 825.

Many applications of laser diodes require a specific linear polarization, typically one of two linear polarizations which, for purposes of this disclosure, may be referred to as horizontal or vertical. Since the output polarization of a laser diode is set by the device physics, it cannot be easily adjusted if the normal output polarization does not match the desired polarization. This invention pertains to a means of rotating the output polarization of a HCSEL device by 90 degrees so that they can be easily designed to provide either horizontally or vertically polarized output.

An example of an application where such flexibility is important is in the design of a laser for use in thermally-assisted magnetic recording. This application involves delivering the light from a laser to a near-field aperture that produces a very small illuminated spot on the magnetic disk in conjunction with a magnetic write field. A near-field aperture is required to produce an illuminated spot much smaller than the wavelength of the light, e.g. smaller than 100 nm. Examples of these apertures are the "C" aperture and the bow tie aperture (1,2). These two apertures, and near-field apertures in general, are very polarization specific. For optimum performance, these two apertures require light polarized along the direction of the magnetic track being written.

The HCSEL laser is well suited to the thermally assisted magnetic head because the laser can be piggybacked on the magnetic slider as shown in FIG. 1. The front facet directs the light to the waveguide and near-field aperture without requiring intervening optics. Given the dimensions of the typical slider and the HCSEL, the TICSEL will be most favorably mounted on the slider with the laser cavity running parallel to the magnetic track direction. However, with this arrangement, the output polarization will in general be in the cross-track direction. Although it is conceivable to rotate the polarization externally to the laser, it would require additional components that add cost and bulk to the overall assembly that would make the device impractical. Thus a means of rotating the polarization by 90 degrees within the HCSEL device, as presented in this invention, is needed.

Referring now to FIGS. 4A-4C, 5 and 6, one embodiment of the invention is shown as an application for a magnetic media disk in a hard disk drive. Although, the invention is shown in this type of application, it is not so limited but has many other applications as will be recognized by those with skill in the art. In the illustrated embodiment, a disk 115 has magnetic media formed in concentric tracks 43 (e.g., one shown) that extend in a direction indicated by arrow 45. The slider 129 includes a magnetic write pole 47 for writing data to the disk 115. The slider 129 also comprises a slider body 49 having an air bearing surface (ABS) 51, and a waveguide 53 with an optical near field aperture 55 adjacent the disk 129.

A laser 61, such as a horizontal cavity, surface emitting laser (HCSEL), is mounted to the slider body 49 opposite the ABS 51. The laser 61 emits a beam 63 that is directed through the waveguide 53 onto the disk 115 for thermally assisted recording (TAR). The beam 63 is reflected by two facets 65, 67 formed in the laser 61 before entering the waveguide 53 for aligning the polarization of the beam 63 with the direction 45 of the concentric tracks 43.

In the embodiment shown, the beam 63 emitted by the laser 61 is initially parallel to the disk 115 (see, e.g., FIG. 4A, the top view of the HCSEL) and the polarization 71 of the beam 63 is orthogonal to the direction 45 of the concentric tracks 43. The first facet 65 reflects the initial beam 63 in an orthogonal direction 73 that is parallel to the disk 115 but changes the polarization 75 of the beam to align with the direction 45 of the concentric tracks 43. The second facet 67 reflects the beam 73 from the first facet 65 toward the disk 115 (i.e., along arrow 77 in FIGS. 4B and 4C), and maintains the new polarization 75 of the beam. The second facet 67 also directs the beam 77 into the waveguide 53 (FIG. 5), through the optical near field aperture 55, and onto the disk 115 adjacent the magnetic write pole 47. The beam 77 may be directed onto the disk 115 directly beneath, in front of or behind the magnetic write pole 47.

The invention also comprises a method of forming facets in a laser. Two mirror facets may be etched at different angles in a single step. Using technology such as reactive ion-beam etching, or RIBE, as used for forming the facet on a conventional HCSEL, two mirrors may be formed for polarization rotation with two separate etch steps. However if these could both be made in a single etch step, the manufacturing costs would be reduced and in fact would be essentially the same as for the current single mirror HCSEL process. This section describes how, by choosing the appropriate etch direction, two mirrors with different facet orientations can be formed in a single etch step.

Figure 10:
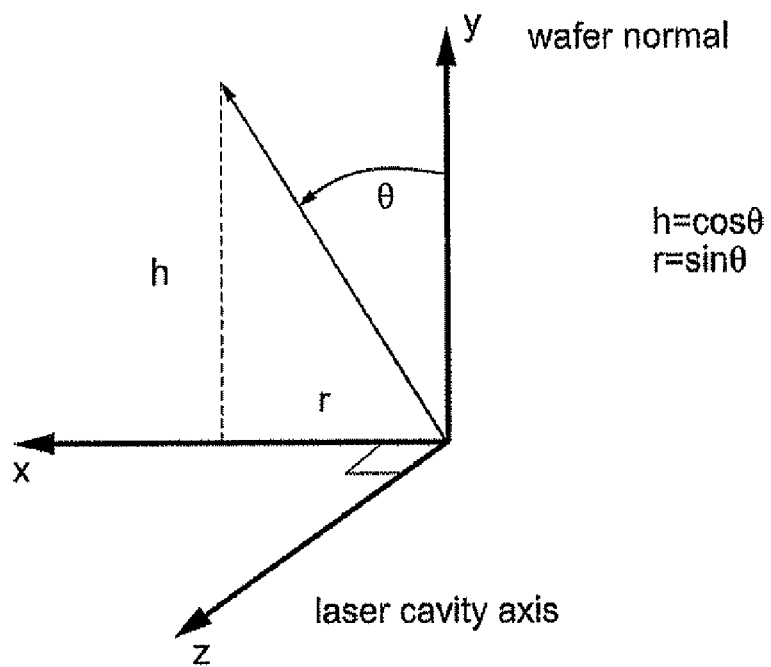
FIGS. 10-12 are coordinates that define geometries for forming multiple facets in a HCSEL laser to rotate polarization according to a method of the invention.

FIG. 10 illustrates a basic coordinate system, including a z-axis along the laser cavity and in the direction of propagation of the beam in the cavity. The y-axis is normal to the plane of the wafer and the x axis is in the plane of the wafer. The angles $\theta$ and $\phi$ need to be found that define the desired orientation of the RIBE to simultaneously form the two mirrors for polarization rotation with their respective facet orientations. The angle $\theta$ is the angle between the y-axis and the RIBE direction. The angle $\phi$ is the angle between the x-y plane and the plane formed by the RIBE axis and the y-axis.

Figure 11:
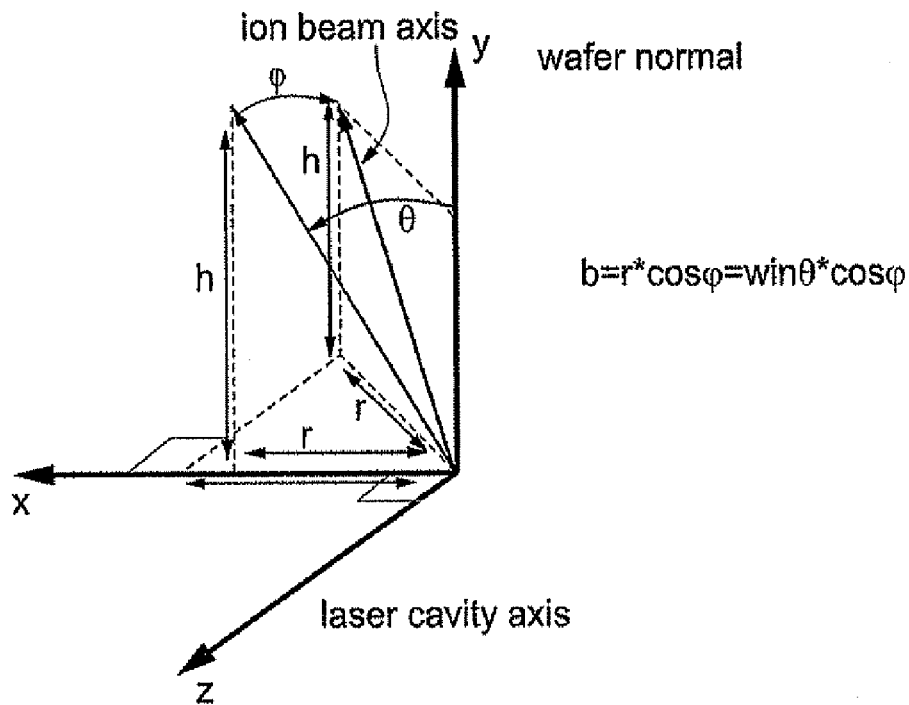

Although the ion beam etching orientation or axis must lie in the plane of the mirror facet, it can impinge at any angle within that plane. So the ion beam axis is rotated out of the x-y plane by an angle $\phi$ as shown in FIG. 11. With this orientation, the plane formed by the ion beam axis and the y axis is normal to the wafer surface (the x-z plane). If a mask has an edge along the projection of the ion beam axis into the x-z plane (e.g., the leftmost line denoted "r"), the ion beam etches a facet that is normal to the surface and oriented at the angle $\phi$ from the x-y plane. The ion beam can be oriented at any angle $\theta$ in this plane, and the facet will still be normal to the wafer surface. Thus, $\theta$ may be chosen to achieve the desired orientation of the second mirror facet.

Figure 12:
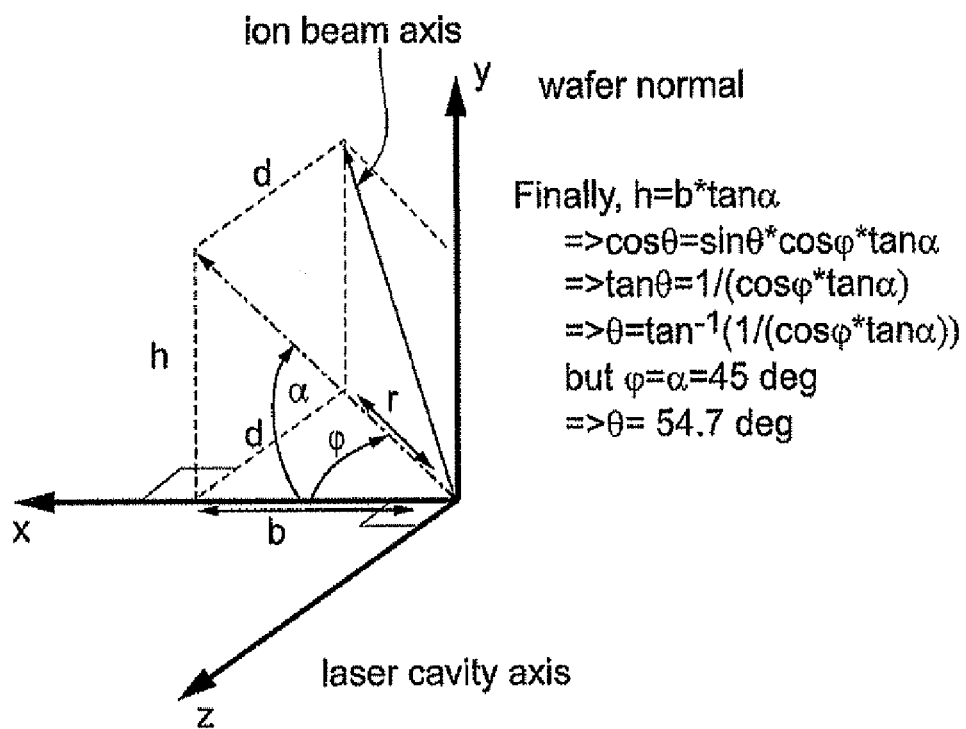

FIG. 12 shows how the orientation of the second facet is defined. If a mask has an edge parallel to the line d, the line that projects the ion beam axis back into the x-y plane and, thus, parallel to the z-axis forms a facet that makes an angle $\alpha$ with respect to the wafer surface. Although the ion beam axis does not lie along the dot-dashed line, it does lie in the plane formed by that line and the ion beam axis. Again the freedom to orient the beam at any angle in this plane is being exploited. With this, the expression for $\theta$ may be found, given the desired $\phi$ and $\alpha$. The final expression for $\theta$ is: $\theta = \tan^{-1}(1/(\cos\phi * \tan\alpha))$. Using this formula, if $\phi = \alpha = 45$ degrees, then $\theta = 54.7$ degrees. This formula can be used to find the appropriate value of $\theta$ for any set of values of $\phi$ and $\alpha$.

In one embodiment, the method of forming facets in a laser comprises providing a laser diode 61 (FIGS. 3A-3C) having a longitudinal axis z, a lateral axis x, and a transverse axis y. The laser diode 61 also has a surface 62 extending in a plane defined by the longitudinal and lateral axes and perpendicular to the transverse axis. In a subsequent step, the surface 62 of the laser diode 61 is masked and two windows 66, 68 (FIG. 3C) are provided in the mask 64. Thereafter, a single ion beam 70 (e.g., reactive ion beam etching) is emitted at the masked laser diode to simultaneously form two facets 65, 67 in the laser diode with the single ion beam through the two windows.

Figure 4A:
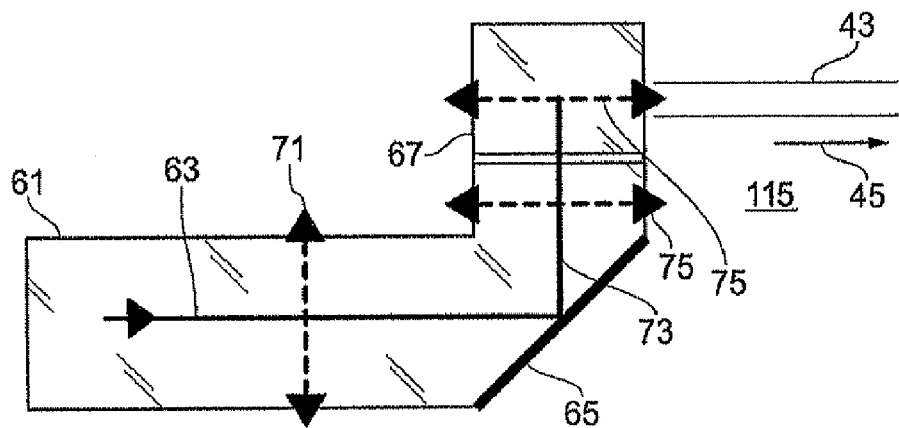
FIGS. 4A-4C are top, side and front end views, respectively, of one embodiment of a laser for a TAR device constructed in accordance with the invention.
Figure 4B:
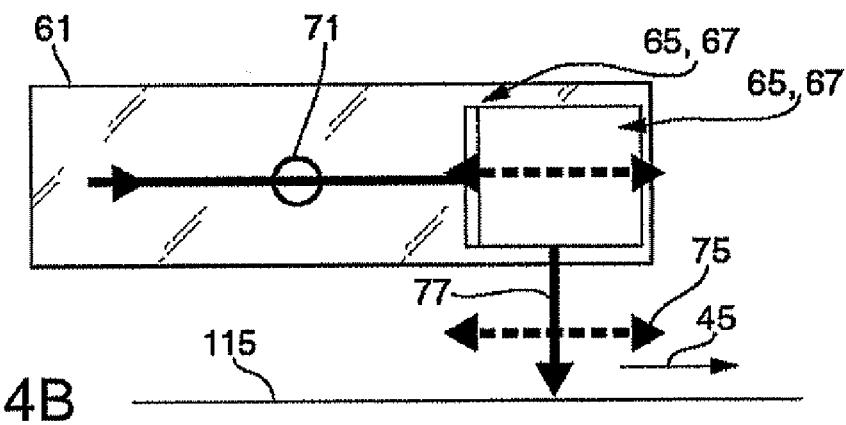
Figure 4C:
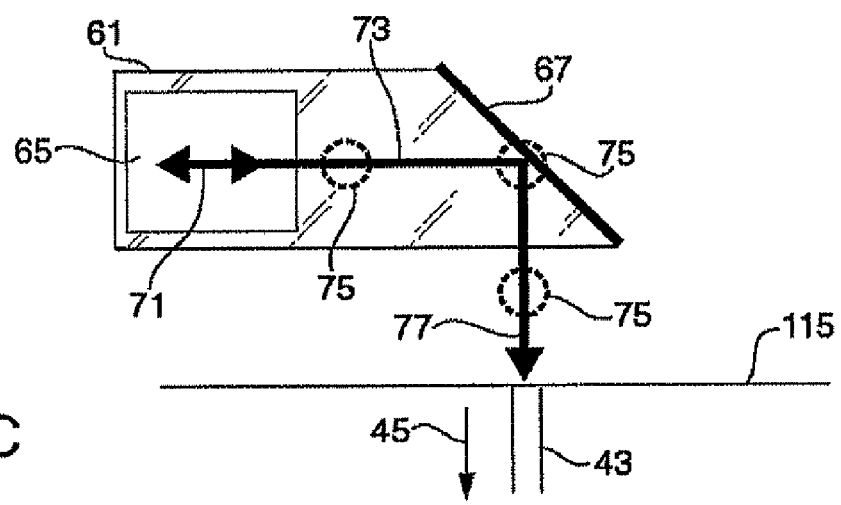
Figure 5:
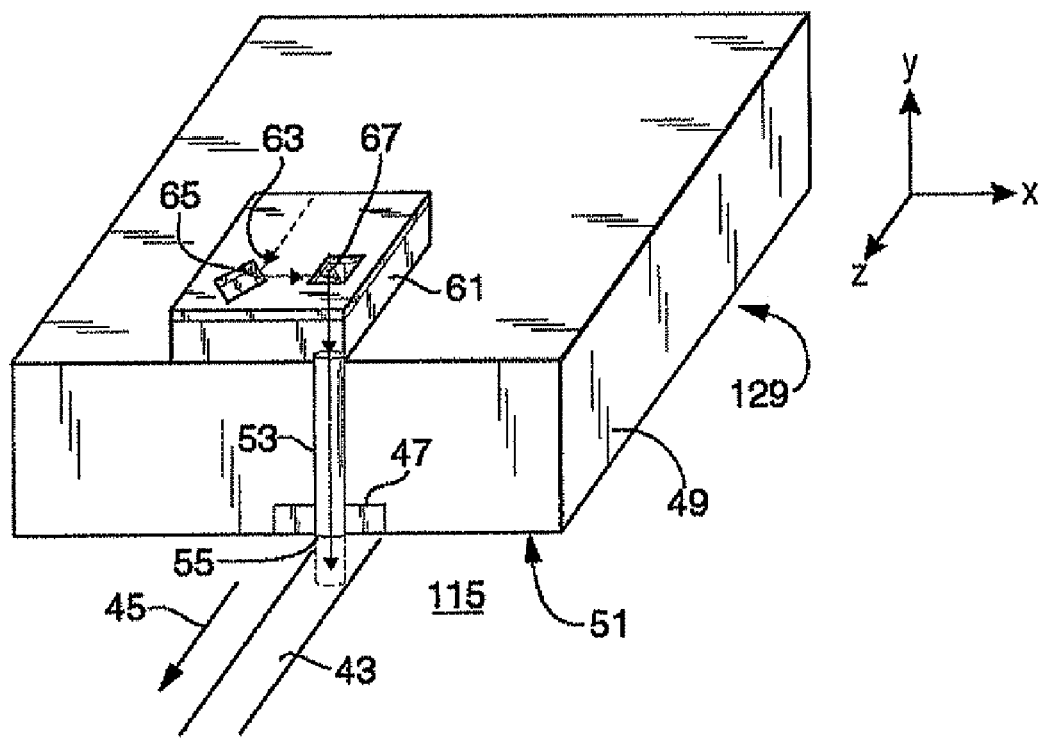
FIG. 5 is a schematic isometric view of one embodiment of a TAR device, and single step etching process, and is constructed in accordance with the invention.

Comparing FIGS. 4A-4C, the first facet 65 is formed on the longitudinal axis and oriented at an angle to the longitudinal and lateral axes but parallel to the transverse axis. The second facet 67 is laterally spaced apart from but transversely aligned with the first facet 65, parallel to the longitudinal axis, and oriented at an angle to the lateral and transverse axes.

The present invention has several advantages, including a laser beam polarization rotation within the laser device without requiring any external components. Unlike prior art devices, the fabricated laser diode structure is simple to fabricate and greatly reduces complications during the fabrication process. The invention is also quite efficient at polarization rotation for the very short device lengths required. Furthermore, the invention eliminates the need for half-wave plates, and avoids non-linear effects in fibers or active elements using Faraday or Kerr effects. The invention also avoids the need for discrete components, is not wavelength dependent, offers a very low manufacturing cost and eliminates thermal stress.

While the invention has been shown or described in only some of its forms, it should be apparent to those skilled in the art that it is not so limited, but is susceptible to various changes without departing from the scope of the invention.

We claim:

1. A disk drive, comprising:
   an enclosure;
   a disk rotatably mounted to the enclosure and having magnetic media with concentric tracks;
   an actuator having a slider with a magnetic write pole for writing data to the disk; the slider further comprising:
   a slider body having an air bearing surface (ABS) adjacent the magnetic write pole, and a waveguide with an optical near field aperture adjacent the disk; and
   a laser mounted to the slider body for emitting a beam that is directed through the waveguide onto the disk for thermally assisted recording (TAR), the beam being reflected by two facets before exiting the laser and entering the waveguide for aligning a polarization of the beam with a direction of the concentric tracks.

2. A disk drive according to claim 1, wherein the laser is mounted to the slider body opposite the ABS.

3. A disk drive according to claim 1, wherein the laser is a horizontal cavity, surface emitting laser (HCSEL).

4. A disk drive according to claim 1, wherein the laser has a longitudinal axis along which the beam is initially directed, and an initial polarization of the beam is orthogonal to the laser body and in a plane of an active layer of the laser.

5. A disk drive according to claim 4, wherein a first one of the facets reflects the initial beam in an orthogonal direction relative to the laser and maintains the initial polarization of the beam, and a second one of facets reflects the beam from said first one of the facets toward the disk, and rotates the polarization of the beam by 90 degrees to align with the direction of the concentric tracks, and directs the beam into the waveguide, through the optical near field aperture, and onto the disk adjacent the magnetic write pole.

6. A disk drive according to claim 5, wherein the beam is directed onto the disk either in front of or behind the magnetic write pole.

7. A disk drive, comprising:
an enclosure;
a disk rotatably mounted to the enclosure and having magnetic media with concentric tracks;
an actuator having a slider with a magnetic write pole for writing data to the disk; the slider further comprising:
a slider body having an air bearing surface (ABS) adjacent the magnetic write pole, and a waveguide with an optical near field aperture adjacent the disk;
a laser, comprising a horizontal cavity, surface emitting laser (HCSEL), mounted to the slider body opposite the ABS for emitting a beam that is directed through the waveguide onto the disk for thermally assisted recording (TAR), the beam being reflected by two facets before exiting the laser and entering the waveguide for aligning a polarization of the beam with a direction of the concentric tracks; wherein
the beam emitted by the laser is initially parallel to the disk and the polarization of the beam is orthogonal to the direction of the concentric tracks, a first one of the facets reflects the initial beam in an orthogonal direction that is parallel to the disk and maintains the polarization of the beam, and a second one of facets reflects the beam from said first one of the facets toward the disk, changes the polarization of the beam to align with the direction of the concentric tracks, and directs the beam into the waveguide, through the optical near field aperture, and onto the disk adjacent the magnetic write pole.

8. A disk drive according to claim 7, wherein the beam is directed onto the disk either in front of or behind the magnetic write pole.

* * * * *